(12) United States Patent
Shkoury

(10) Patent No.: US 12,199,206 B2
(45) Date of Patent: Jan. 14, 2025

(54) SOLAR PANEL ARRANGEMENT

(71) Applicant: Solaredge Technologies Ltd., Herzeliya (IL)

(72) Inventor: Roy Shkoury, Rehovot (IL)

(73) Assignee: Solaredge Technologies Ltd., Herzeliya (IL)

( * ) Notice: Subject to any disclaimer, the term of this patent is extended or adjusted under 35 U.S.C. 154(b) by 722 days.

(21) Appl. No.: 16/986,881

(22) Filed: Aug. 6, 2020

(65) Prior Publication Data

US 2021/0043789 A1    Feb. 11, 2021

Related U.S. Application Data

(60) Provisional application No. 62/883,801, filed on Aug. 7, 2019.

(51) Int. Cl.
*H01L 31/0443* (2014.01)
*H01L 31/05* (2014.01)
*H01L 31/18* (2006.01)
*H02S 40/34* (2014.01)
*H02S 50/00* (2014.01)

(52) U.S. Cl.
CPC ...... *H01L 31/0443* (2014.12); *H01L 31/0508* (2013.01); *H01L 31/18* (2013.01); *H02S 40/34* (2014.12); *H02S 50/00* (2013.01)

(58) Field of Classification Search
CPC . H01L 31/05; H01L 31/0504; H01L 31/0508; H01L 31/0443; H01L 31/02021; H02S 40/32; H02S 40/34
See application file for complete search history.

(56) References Cited

U.S. PATENT DOCUMENTS 6,218,606 B1    4/2001  Morizane et al.
10,164,138 B2   12/2018 Jansen et al.
(Continued)

FOREIGN PATENT DOCUMENTS

JP    2012527786 A    11/2012
JP    2016519851 A     7/2016
(Continued)

OTHER PUBLICATIONS

Dec. 15, 2020—EP EESR—EP 20189576.0.
(Continued)

*Primary Examiner* — Golam Mowla
(74) *Attorney, Agent, or Firm* — Banner & Witcoff, Ltd.

(57) ABSTRACT

Apparatus, systems, and methods for designing photovoltaic panels are described herein. The photovoltaic panels are composed substrings of photovoltaic cells. The substrings of photovoltaic cells may be oriented in a horizontal fashion with respect to a layout of the photovoltaic panels. In the event of snow coverage, partial shading, mutual shading, and so forth, orienting the substrings of the photovoltaic cells in this manner enables those substrings which are disposed higher up in the photovoltaic panel to resume operation even while those substrings which are disposed lower down in the photovoltaic panel remain covered, shaded or otherwise blocked or impeded from functioning. Accordingly, the overall productivity of a photovoltaic panel designed as described herein is increased. Related apparatus, systems, and methods are also described.

20 Claims, 12 Drawing Sheets

(56) References Cited

U.S. PATENT DOCUMENTS

| | | | |
|---|---|---|---|
| 2010/0001587 A1* | 1/2010 | Casey | H01L 31/02021 |
| | | | 136/244 |
| 2010/0043862 A1* | 2/2010 | Croft | H01L 31/05 |
| | | | 136/244 |
| 2012/0060895 A1* | 3/2012 | Rubin | H01L 31/048 |
| | | | 136/246 |
| 2012/0098344 A1* | 4/2012 | Bergveld | H02S 40/32 |
| | | | 307/64 |
| 2012/0306279 A1* | 12/2012 | Garabandic | H02J 3/381 |
| | | | 307/85 |
| 2014/0028104 A1 | 1/2014 | Makover et al. | |
| 2014/0070815 A1 | 3/2014 | Liu et al. | |
| 2014/0166066 A1* | 6/2014 | Hennessy | H01L 31/02021 |
| | | | 136/244 |
| 2014/0168835 A1* | 6/2014 | Fornage | H01L 31/02008 |
| | | | 361/57 |
| 2014/0312700 A1 | 10/2014 | Catthoor et al. | |
| 2015/0068577 A1 | 3/2015 | Hou et al. | |
| 2015/0136200 A1 | 5/2015 | Kernahan | |
| 2016/0226438 A1 | 8/2016 | Gibson et al. | |
| 2016/0254401 A1 | 9/2016 | Jansen et al. | |
| 2017/0077869 A1 | 3/2017 | Catthoor et al. | |
| 2018/0233919 A1 | 8/2018 | Gu et al. | |
| 2018/0287555 A1 | 10/2018 | Pomerantz et al. | |
| 2019/0019908 A1* | 1/2019 | Lekx | H01L 31/049 |

FOREIGN PATENT DOCUMENTS

| | | |
|---|---|---|
| JP | 2018170951 A | 11/2018 |
| JP | 2018207134 A | 12/2018 |
| JP | 201996886 A | 6/2019 |
| KR | 10-2017-0118384 A | 10/2017 |
| TW | 201042770 A | 12/2010 |

OTHER PUBLICATIONS

M. Mittag et al., "Cell-to-Module (CTM) Analysis for Photovoltaic Modules with Shingled Solar Cells," 44th IEEE Photovoltaic Specialist Conference, Jun. 2017.

A. Mondon et al., "Comparison of Layouts for Shingled Bifacial PV Modules in Terms of Power Output, Cell-to-Module Ratio and Bifaciality," 35th European PV Solar Energy Conference and Exhibition, Sep. 2018.

"Solaria PowerXT-350R-PD; Solaria PowerXT-345R-D," The Solaria Corporation, Dec. 2017.

N. Klasen et al., "Shingled Cell Interconnection: A new Generation of Bifacial PV-Modules," 7th Workshop on Metallization and Interconnection for Crystalline Silicon Solar Cells, 2017, Apr. 2018.

Mar. 12, 2024—Japanese Office Action—JP App. No. 2020133116.

Jun. 18, 2024—Japanese Final Office Action—JP. App. No. 2020-133116.

* cited by examiner

SOLAR PANEL ARRANGEMENT

CROSS-REFERENCE TO RELATED APPLICATIONS

This application is a non-provisional of and claims priority to U.S. Provisional Patent Application No. 62/883,801, filed Aug. 7, 2019, which is hereby incorporated by reference in its entirety.

BACKGROUND

Solar panels absorb sunlight as a source of energy in order to generate electricity. Typically, solar panels include an array of connected solar cells. The solar cells are typically connected in series to form a string or groups of strings, which output electrical energy from a solar panel. Due to the photovoltaic effect, solar panels are able to use light energy from the sun to generate electricity. Accordingly, solar panels may be referred to as photovoltaic panels, photovoltaic modules, and also as solar modules.

Solar cells are sensitive to light in the sense that their electrical properties, such as their current, voltage, or resistance may vary when they are exposed to light. Exposure to light, for solar cells, is typically exposure to sun light. The connected solar cells in the solar panel are typically referred to as a substring or a substring of solar cells. The substrings of solar cells are joined together to form a string of solar cells. The substrings are frequently connected together at a photovoltaic junction box, which may be located on the back of the photovoltaic solar panel.

SUMMARY

Provided herein are apparatus, systems, and methods for designing photovoltaic panels. The photovoltaic panels are made of substrings of photovoltaic cells. Substrings of photovoltaic cells may be oriented in a horizontal fashion with respect to a layout of the photovoltaic panels. In the event of snow coverage, partial shading, mutual shading, and so forth, orienting the substrings of the photovoltaic cells in this manner enables those substrings which are disposed higher up in the photovoltaic panel to resume operation even while those substrings which are disposed lower down in the photovoltaic panel remain covered, shaded or otherwise blocked or impeded from functioning. Accordingly, the overall productivity of a photovoltaic panel designed as described herein is increased.

BRIEF DESCRIPTION OF THE DRAWINGS

The accompanying drawings, which form a part hereof, show examples of the disclosure. It is to be understood that the examples shown in the drawings and/or discussed herein are non-exclusive and that there are other examples of how the disclosure may be practiced. The present disclosure will be understood and appreciated more fully from the following detailed description, taken in conjunction with the drawings in which.

DETAILED DESCRIPTION

Figure 1:
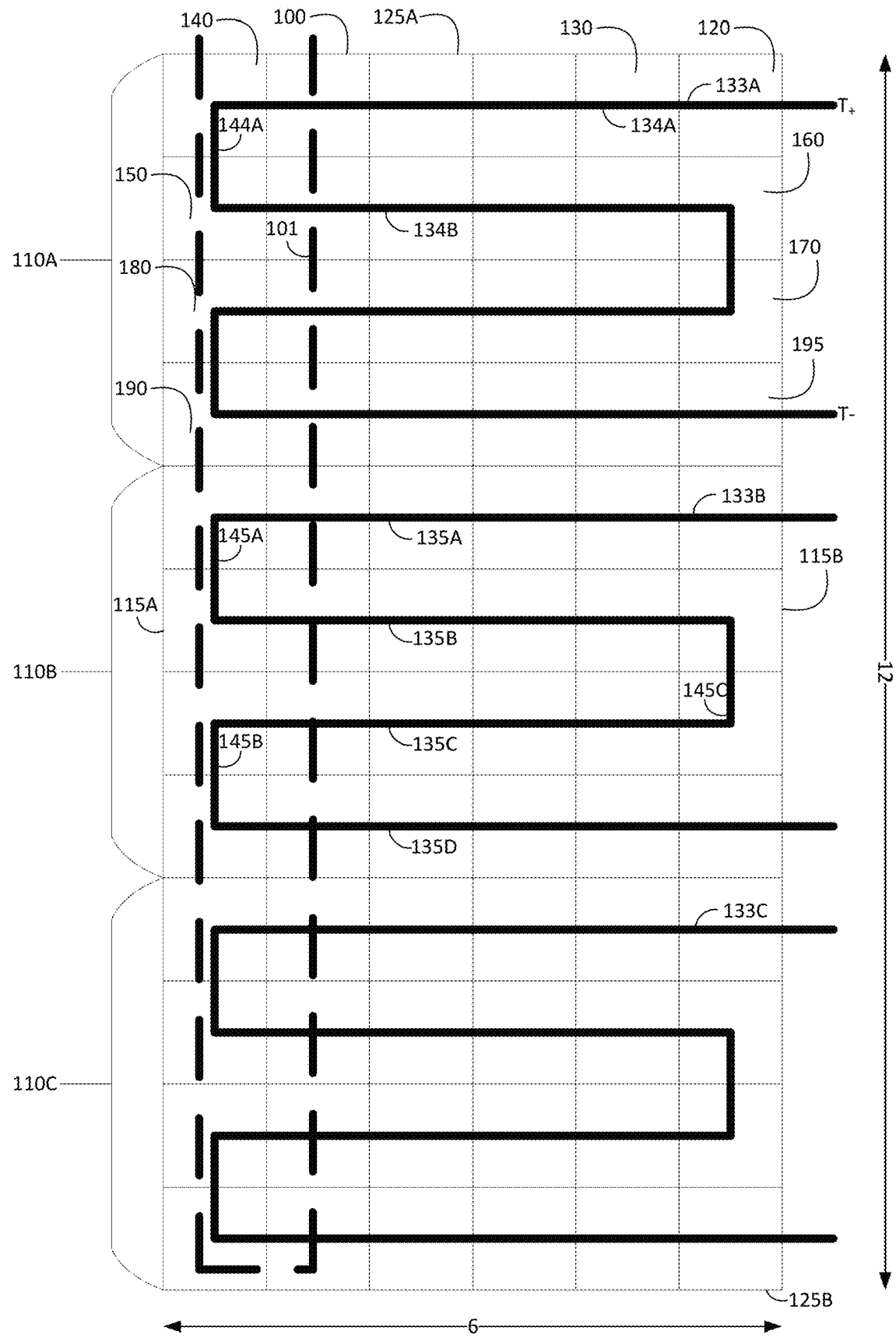
FIG. 1 is a simplified pictorial illustration of a solar panel, depicting an arrangement of substrings of solar cells, in accordance with examples of the present disclosure.

Reference is now made to FIG. 1, which is a simplified pictorial illustration of a solar panel 100, depicting an arrangement of substrings 110A, 110B, 110C of solar cells (such as illustrative solar cells 120, 130, 140, 150, 160, 170, 180, 190, and 195) constructed and operative in accordance with examples of the present disclosure. In some existing solar panel systems, substrings of solar cells may typically be connected in substrings whereby one terminal of the substring may be disposed, for example, at the solar cell in the upper left corner of the solar panel, the substring then descending a first column of solar cells along the length of the solar panel, then connecting to a first solar cell in a second column of solar cells (the second column from the left, in the present example), ascending to the top of the second column of solar cells. A second terminal may then end this substring at the solar cell disposed at the top of this (the second) column of solar cells. By way of example, such a substring may be formed of solar cells along the path of dashed line 101 in FIG. 1. In this fashion, solar cells are connected in two columns of solar cells, to form an extended "U" shaped substring. Depending on the size of the solar panel, additional columns of solar cells may be connected in this up and down fashion. A common configuration of solar panels has 6*10 solar cells in an array. In such a configuration, there may typically be three substrings of 2*10 solar cells. Another common configuration of solar panels has 6*12 solar cells in an array. In such a configuration, there may typically be three substrings of 2*12 solar cells.

FIG. 1 depicts the solar panel 100 having a 6*12 solar cell configuration. Solar cells (such as illustrative solar cells 120, 130, 140, 150, 160, 170, 180, 190, and 195) in the solar panel 100 are depicted in FIG. 1 as small rectangles, the plurality of which form a larger rectangle representing the solar panel 100. Illustrative solar panel 100 is shown having solar cells arranged in twelve rows and six columns. The first row includes solar cells 140, 130 and 120 (along with three solar cells that do not have reference numbers in FIG. 1). The first column includes solar cells 140, 150, 180 (and seven other solar cells), and so on.

Solar panel 100 may accordingly be considered as the rectangle having two parallel vertical long edges 115A, 115B and two parallel horizontal short edges 125A, 125B. It is appreciated that in examples where the solar panel 100 is a square, one arbitrarily selected set of parallel edges may be considered the two parallel vertical long edges 115A, 115B, and a second arbitrarily selected set of parallel edges may be considered the two parallel horizontal short edges 125A, 125B.

The substrings 110A, 110B, 110C are oriented from side-to-side, substrings 110A, 110B, 110C having a length of conductive material 133A, 133B, 133C. Lengths of conductive material 133A, 133B, 133C, includes a plurality of long members, such as long members 134A, 134B, 135A, 135B, 135C, 135D, and at least one short member, such as short members 144A, 145A, 145B, 145C. The conductive material includes one or more photovoltaic cells. In some cases, substrings 110A, 110B, 110C include series-connected photovoltaic cells electrically connected to one another using a conductor (e.g., solder, or a different conductor).

A "long member" includes a length of the conductive material connecting a plurality of consecutive solar cells from different columns in a row. Thus, consecutive solar cells 120 and 130 in a first row are connected by length of conductive material 133A along one long member 134A of the substring 110A.

A "short member" is a length of conductive material, which typically bridges between two rows of solar cells. In examples of the present disclosure, each long member of the plurality of long members are typically parallel to one another. Additionally, the long members are typically also parallel to the two parallel short edges 125A, 125B. Accordingly, when the solar panel 100 is installed in a portrait orientation, substring 110A is above substring 110B and substring 110C; substring 110B is between substring 110A and substring 110C; and substring 110C is beneath substring 110A and substring 110B.

It is also appreciated that, in a substring, two of the long members, typically on the extremities of the substring, extend to a positive terminal T+ of the substring and to a negative terminal of the substring T−. It is noted that although the positive terminals T+ and the negative terminals T− are depicted as extending outside the solar panel 100, in practice, the substrings 110A, 110B, 110C are connected in parallel in the solar panel, and exit through a slot, typically disposed in the back of the solar panel 100 to an external junction box. As will be discussed below with reference to FIGS. 6 and 7, in some cases, the external junction box is shared among two solar panels 100.

As an example, the short members 144A, 145A, 145B, 145C have a length that extends across two solar cells in the same column and different rows. Additionally, the short members are typically also parallel to the two parallel long edges 115A, 115B.

There is typically one fewer short member than long members. By way of example, substring 110B is depicted as having four long members 135A, 135B, 135C, 135D and three short members 145A, 145B, 145C. As will be described below with reference to FIG. 3, a substring may include a length of conductive material 293A having two long members and one short member. Additionally, it is noted that in order for the positive and negative terminals T+ and T− to be on the same edge of the solar panel 100 (long edge 115B in this example), there are an even number of long members.

Accordingly, a substring, such as substring 110A has its positive terminal T+ situated external to solar cell 120, and a first long member 134A of the substring 110A proceeds to adjacent solar cell 130, and then traverses along the width of the solar panel 100, parallel to short edge 125A, to solar cell 140. The length of conductive material 133A of substring 110A then continues as a short member 144A. Short member 144A traverses along the length of the solar panel 100, parallel to long edge 115A, into the next row of solar cells, beginning at solar cell 150. A second long member 134B then begins at solar cell 150 and traverses along the width of the solar panel 100 to solar cell 160. This pattern of a long member traversing the columns of the solar panel along a row parallel to the short edges 125A, 125B, continuing as a short member traversing the rows of the solar panel along a column parallel to the long edges 115A, 115B, into a next row of solar cells, traversing the columns of the solar panel along the next row parallel to the short edges 125A, 125B (albeit in the opposite direction as the previous traversal), and so forth, continues through solar cell 170, to solar cell 180, then to solar cell 190, and finally terminating, with negative terminal T− of the substring external to solar cell 195.

In some examples the terminals can be arranged in a different manner, e.g., with the negative terminal T− situated external to solar cell 120, and the positive terminal T+ situated external to solar cell 195.

Figure 2A:
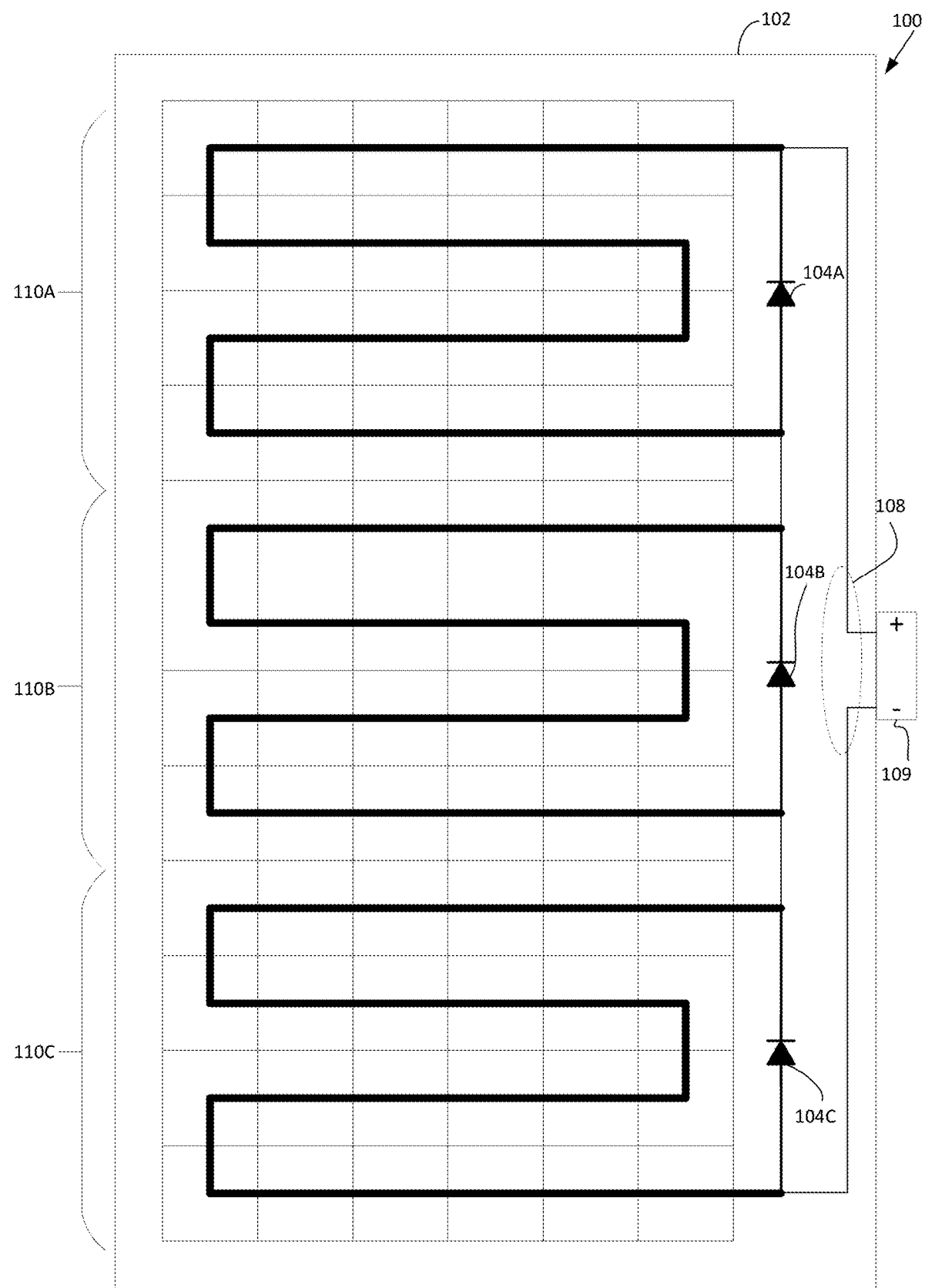
FIG. 2A is a depiction of an implementation of the solar panel.

Reference is now made to FIG. 2A, which is a depiction of an implementation of the solar panel 100, depicting the solar panel 100 in a frame 102, and depicting illustrative connections between the substrings of solar cells. The frame 102 provides protection and structure to solar panel 100. The substrings 110A, 110B, 110C are here depicted as having bypass diodes 104A, 104B, 104C.

Bypass diodes 104A, 104B, 104C may function to increase power generated by solar panel 100 and/or eliminate hot-spot phenomena in the substrings 110A, 110B, 110C, which can damage solar cells and even cause fire, for example, if light hitting a surface of the solar cells in the solar panels 100, 200 is not uniform, and/or if one of the solar cells in the solar panel is damaged. The bypass diode(s) may be added to substrings 110A-110C of the solar panel 100. In some examples, one bypass diode is added for up to 20 or 24 solar cells (e.g., in a case where a substring is four rows having six solar cells per row). Such a configuration may eliminate the creation of hot-spots and may enable the solar panel 100 to operate with high reliability throughout their lifetime. Additionally, in cases of partial or total shading of one or more substrings 110A-110C, bypass diodes prevent drops in power produced by the remaining substrings 110A-110C which are not partially or totally shaded by routing current to bypass damaged or shaded solar cells.

Positive and negative terminals of the substrings 110A-110C may exit from inside the solar panel 100 via a slot 108 (depicted in FIG. 2 as an oval), typically disposed in the rear side of the solar panel 100. The positive and negative terminals of the substrings 110A-110C may be attached to an optimizer or junction box 109.

Figure 2B:
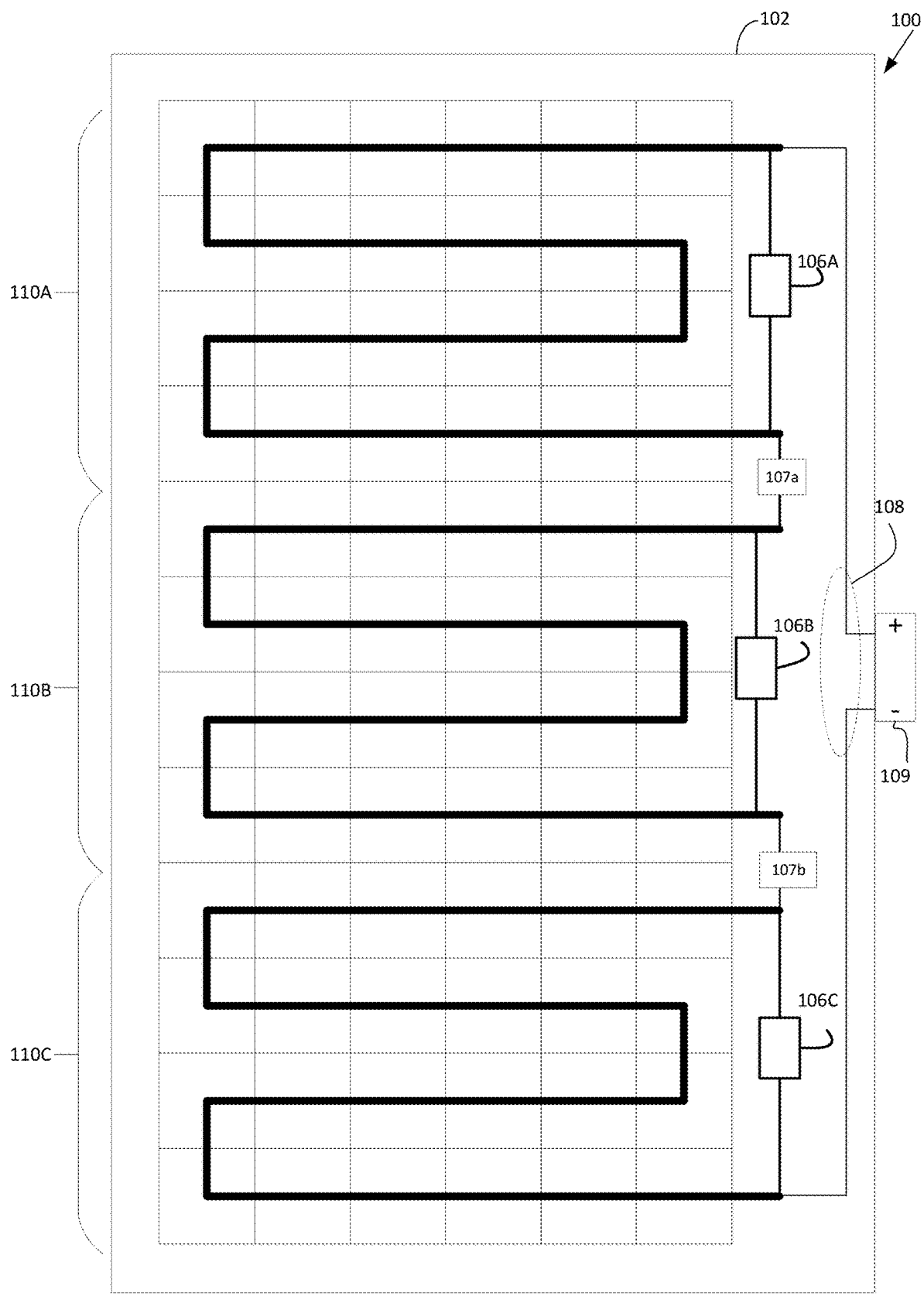
FIG. 2B is a depiction of another implementation of the solar panel.

Reference is now made to FIG. 2B, which is a depiction of another implementation of the solar panel 100. FIG. 2B provides an illustrative case where the substrings are connected to a DC/DC converter (sometimes known as an "optimizer"), depicted as boxes 106A, 106B, 106C. Such DC/DC converters typically may be a controller which drives the optimizers to execute Maximum Power Point Tracking (MPPT) and/or Impedance Matching, in order to help increase an amount of energy harvested from the substrings 110A, 110B, and 110C. Accordingly, connecting the optimizer to the substring will enable performing MPPT on a per-substring basis.

Alternatively or additionally, a DC/AC converter configured to execute MPPT or Impedance Matching (sometimes known as a "microinverter") may be disposed across the substrings 110A, 110B, and 110C, i.e., as the boxes 106A, 106B, 106C. Outputs of the DC/AC converters may be connected in series, and solar panel 100 may output an AC voltage. In still another implementation, in addition to or instead of DC/DC and/or DC/AC converters, the boxes 106A, 106B, 106C may have switches connected across the substrings 110A, 110B, and 110C, and a controller may be configured to selectively close one or more of the switches to substantially short-circuit an underperforming, shaded or damaged substring. The switches may be implemented using, for example, metal-oxide semiconductor field-effect transistors (MOSFETs) having body diodes oriented in the same direction as diodes 104A-104C of FIG. 2A. The body diodes may provide a first bypass across one of substrings 110A, 110B, and 110C, and a second, lower-impedance bypass may be provided by the controller operating the MOSFET to be ON. If bypass switches are connected along with a DC/AC converter across the substrings, bidirectional switches (e.g., back-to-back MOSFETs) may be used.

Alternatively or additionally, a switch 107A, 107B, (depicted as boxes in FIG. 2B) may be connected between the substrings 110A, 110B, and 110C. The switch 107A, 107B may have a field-effect transistor (FET), such as a metal-oxide semiconductor field-effect transistor (MOSFET), a junction gate field-effect transistor (JFET), a bipolar junction transistor (BJT), or other appropriate switch. Use of the switch 107A, 107B, disconnecting one or more of the individual substrings 110A-110C, in the event of an overheating, over-voltage, over-current, or other event in one or more of the substrings 110A-110C. Disconnecting one or more of the individual substrings 110A-110C may serve to reduce total voltage output by a series connection of solar cells, which may increase safety.

It is appreciated that the above examples, DC/DC converters or DC/AC converters 106A, 106B, 106C and switches 107A, 107B may be implemented either together, as depicted in FIG. 2B, or separately, where only the DC/DC converters or DC/AC converters 106A, 106B, 106C and not the switches 107A, 107B may be implemented, or alternatively, where only the switches 107A, 107B may be implemented, and not the DC/DC converters or DC/AC converters 106A, 106B, 106C. Additional combinations of either or both of the DC/DC converters or DC/AC converters 106A, 106B, 106C and the switches 107A, 107B may be implemented. The above combinations are intended to be examples and not limiting.

It is also appreciated that the DC/DC converters or DC/AC converters 106A, 106B, 106C and switches 107A, 107B will be driven by a controller (not depicted, briefly mentioned above. Such controllers may draw auxiliary power from one or more of the substrings 110A, 110B, and 110C.

Figure 2C:
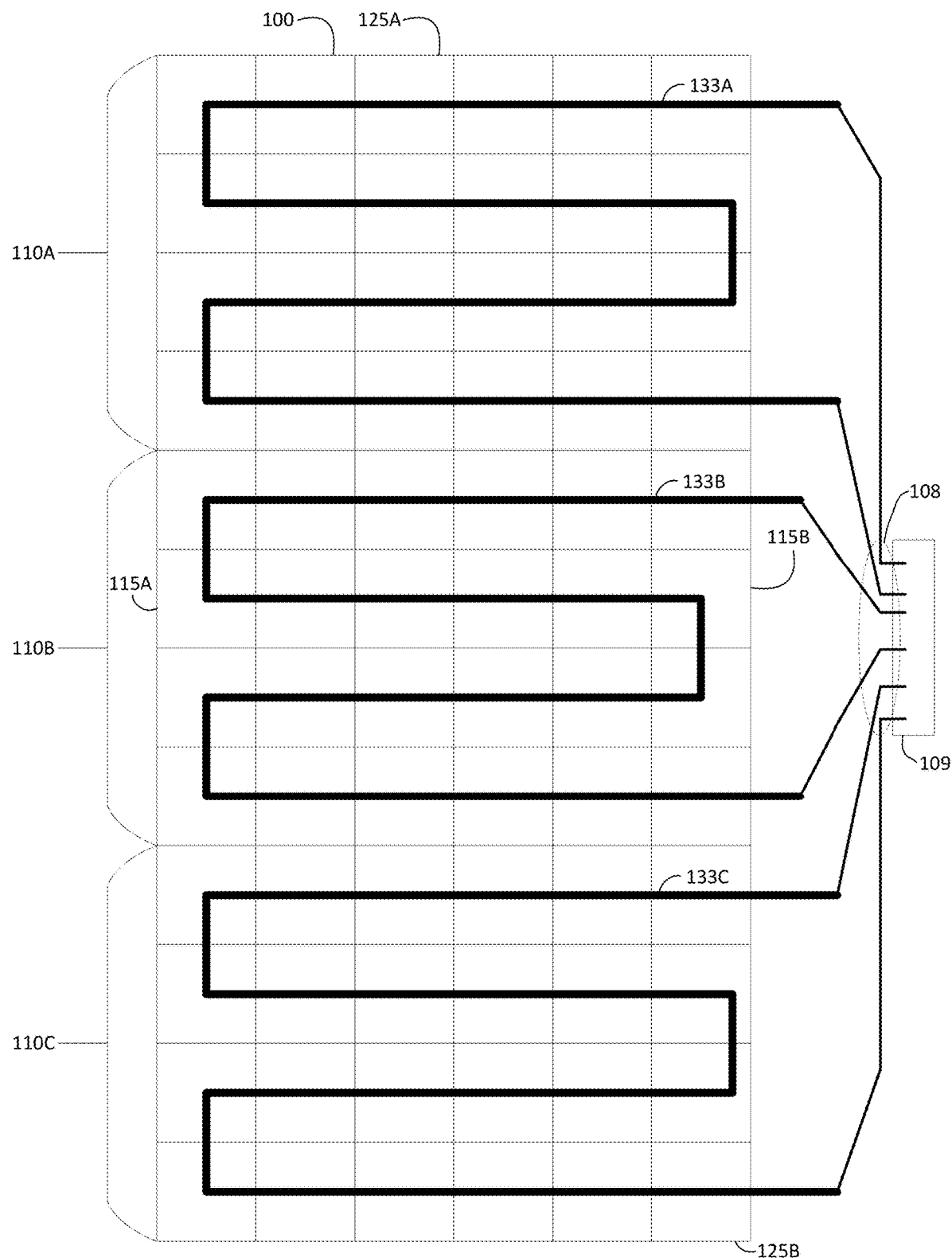
FIG. 2C is a depiction of the solar panel where a length of conductive material from the substrings of solar panels enters into a junction box.

Reference is now made to FIG. 2C which is a depiction of the solar panel 100 where a length of conductive material 133A, 133B, 133C from the substrings 110A, 110B, 110C of solar panels enters into a junction box 109. The lengths of conductive material 133A, 133B, 133C exit the solar panel 100 through the slot 108 in order to enter the junction box 109. For example, ribbon wire may be used as a part of the length of conductive material that passes through the slot. A first pair of terminals, T1+ and T1− from substring 110A, a second pair of terminals, T2+ and T2− from substring 110B, and a third pair of terminals, T3+ and T3− from substring 110C are depicted passing through the slot 108 and continuing into the junction box. According to features of the disclosure, multiple slots may be provided, with each slot accommodating one of the substrings (e.g. allowing passage of ribbon wire from one of the substrings through the slot and into the junction box).

Figure 2D:
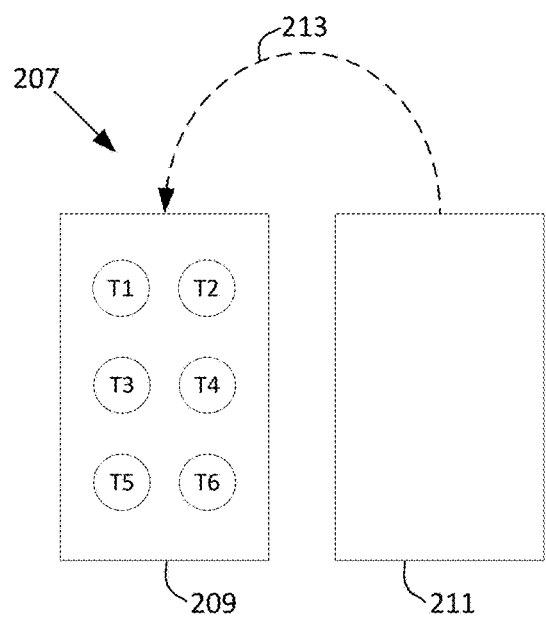
FIGS. 2D and 2E are a depiction of the junction box.
Figure 2E:
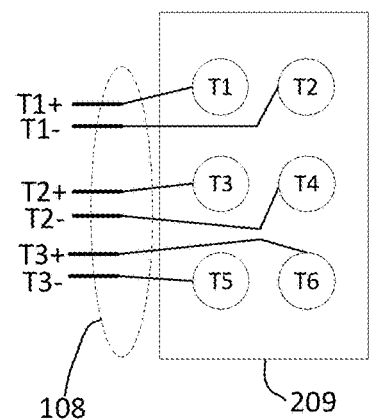

Reference is now made to FIGS. 2D and 2E, which are a depiction of a junction box 207. The junction box 207 has a base 209 which has terminals T1-T6 to receive the terminals T1+, T1−, T2+, T2−, and T3+, and T3− from the substrings 110A, 110B, 110C. The junction box 207 has a lid 211, which may be placed over the base 209 in order to cover the junction box 207 after installation, as indicated by the curved, dotted arrow 213. Diodes, which may be the same as or similar to diodes 104A, 104B, 104C, switches, which may be the same as or similar to switches 106A, 106B, 106C, 107A, 107B, DC/DC or DC/AC converters (which may function as substring optimizers), and so forth may be connected between T1-T6 to form a panel 100 according to FIGS. 2A and 2B. Additionally or alternatively, diodes, switches or power converters may disposed in the lid 207 so as to connect between terminals T1-T6.

In FIG. 2E terminals T1+, T1− (coming from substring 110A), T2+, T2− (coming from substring 110B), and T3+, and T3− (coming from substring 110C) are shown so that terminal T1+ is connected to terminal T1. Similarly, terminal T1− is connected to terminal T2, and so forth. Accordingly, substring 110A is connected to the junction box 209.

Figure 3:
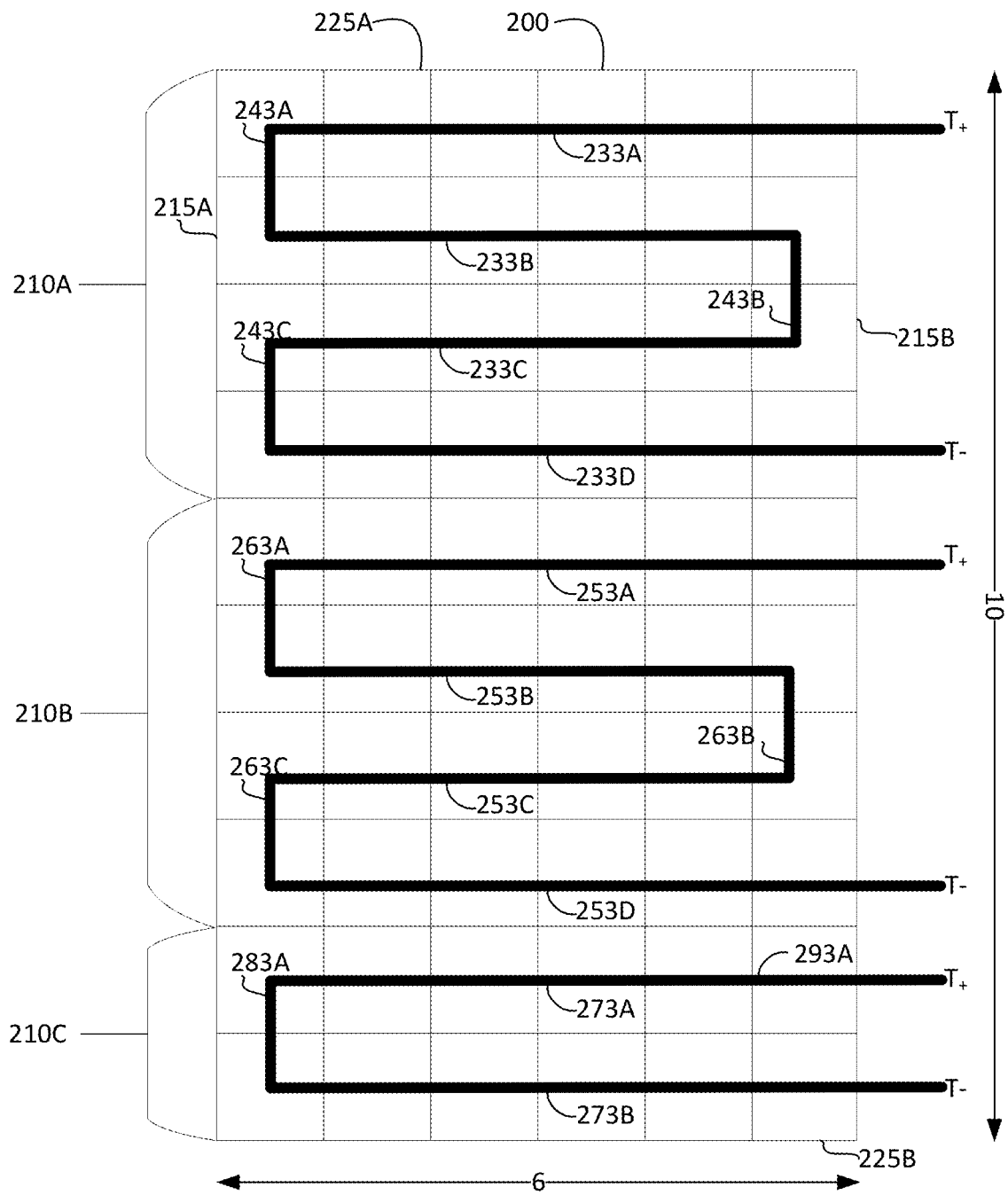
FIG. 3 is a simplified pictorial illustration of a solar panel, depicting an arrangement of substrings of solar cells, in accordance with examples of the present disclosure.

Reference is now made to FIG. 3, which is a simplified pictorial illustration of an example of a solar panel 200, depicting an arrangement of substrings 210A, 210B, 210C of solar cells. The solar panel 100 of FIG. 1 is depicted as having a length of 12 solar cells and a width of six solar cells, for a total of 72 solar cells. Since the number of rows of solar cells of the solar panel 100, in this case a length of 12 solar cells, is divisible by the number of substrings, in this case 3, then a number of solar cells in the substrings 110A, 110B, 110C may be equal (i.e., they have the same number of solar cells as one another, in this case 12 rows/3 substrings=4 rows, 4 rows*6 columns=24 solar cells each). The solar panel 200 depicted in FIG. 3, by contrast, is depicted as having a length of 10 solar cells and a width of 6 solar cells, for a total of 60 solar cells. As opposed to the number 12, the number 10 is not evenly divisible by the number of substrings, in this case 3, to result in a whole number. As such, the substrings 210A, 210B, 210C in the solar panel 200 of FIG. 3 do not all have the same number of solar cells as one another. By way of example, substrings 210A and 210B include four rows of solar cells, while substring 210C includes two rows of solar cells. A reason for this particular distribution of the substrings 210A, 210B, 210C will be provided below. As with solar panel 100 of FIG. 1, solar panel 200 has two parallel vertical long edges 215A, 215B and two parallel horizontal short edges 225A, 225B.

It is appreciated that solar panels 100 and 200 are depicted with three substrings. The number of substrings depicted is arbitrary and by way of example only, with no intention to limit an actual number of substrings used in practice. A decision to use a particular number of substrings in a particular solar panel is a design consideration, which may be made at the time when the solar panel is manufactured, if not prior to that time.

As noted above, substrings 210A and 210B both are the same length, i.e., 4 rows of solar cells, including:
- a long member 233A, 253A terminating in a positive terminal T+;
- three short members 243A-243C, 263A-263C;
- two intermediary long members, 233B-233C, 253B-253C; and
- a long member 233D, 253D terminating in a negative terminal T−.

By contrast, substring 210C is disposed at the bottom of the solar panel 200. Therefore, in most circumstances, when solar panel 200 is fully or partially shaded, and therefore, a power production ability of the solar panel 200 is reduced, typically, substring 210C will be the last substring to transition from being shaded to being unshaded. Since the substrings 210A, 210B, 210C are formed by adding solar cells in series with the length of conductive material connecting the solar cells, the amount of power produced by one substring is a function of the number of solar cells the substring includes. Since the lowest substring 210C in the solar panel 200 is often the last substring to transition from being shaded to being unshaded (due to shading caused by adjacent rows of solar panels), by either full or partial shading (i.e., the power potentially produced by substring 210C is reduced or totally lost), it may be preferable to have the smallest substring fully or partially shaded for the longest amount of time.

Accordingly, substring 210C includes two long members 273A and 273B, and one short member 283A disposed between the two long members 273A and 273B. Various scenarios of partial shading will be discussed below at greater length, with reference to FIG. 6.

The positive terminal T+ and the negative terminal T− of an individual substring 110A-110C, 210A-210C in the solar panel 100, 200 may be connected to a power converter (not depicted) configured to execute MPPT or impedance matching, in order to help increase an amount of energy harvested from the solar panel 100, 200. In other examples, for example where there are four substrings, instead of the three substrings 110A-110C, 210A-210C as depicted in FIGS. 1 and 2, in the solar panel 100, 200, two consecutive substrings (e.g., 210A and 210B) of the four substrings may share an optimizer. Other appropriate arrangements of substrings 110A-110C, 210A-210C and optimizers or micro-optimizers may be used as well.

Alternatively or additionally, multiple substrings may be connected to a bypass diode shared by the multiple substrings. Further alternatively or additionally, the entire solar panel 100, 200 may be connected to a bypass diode. Still further, alternatively or additionally, the substrings may be connected to a bypass diode.

Figure 4:
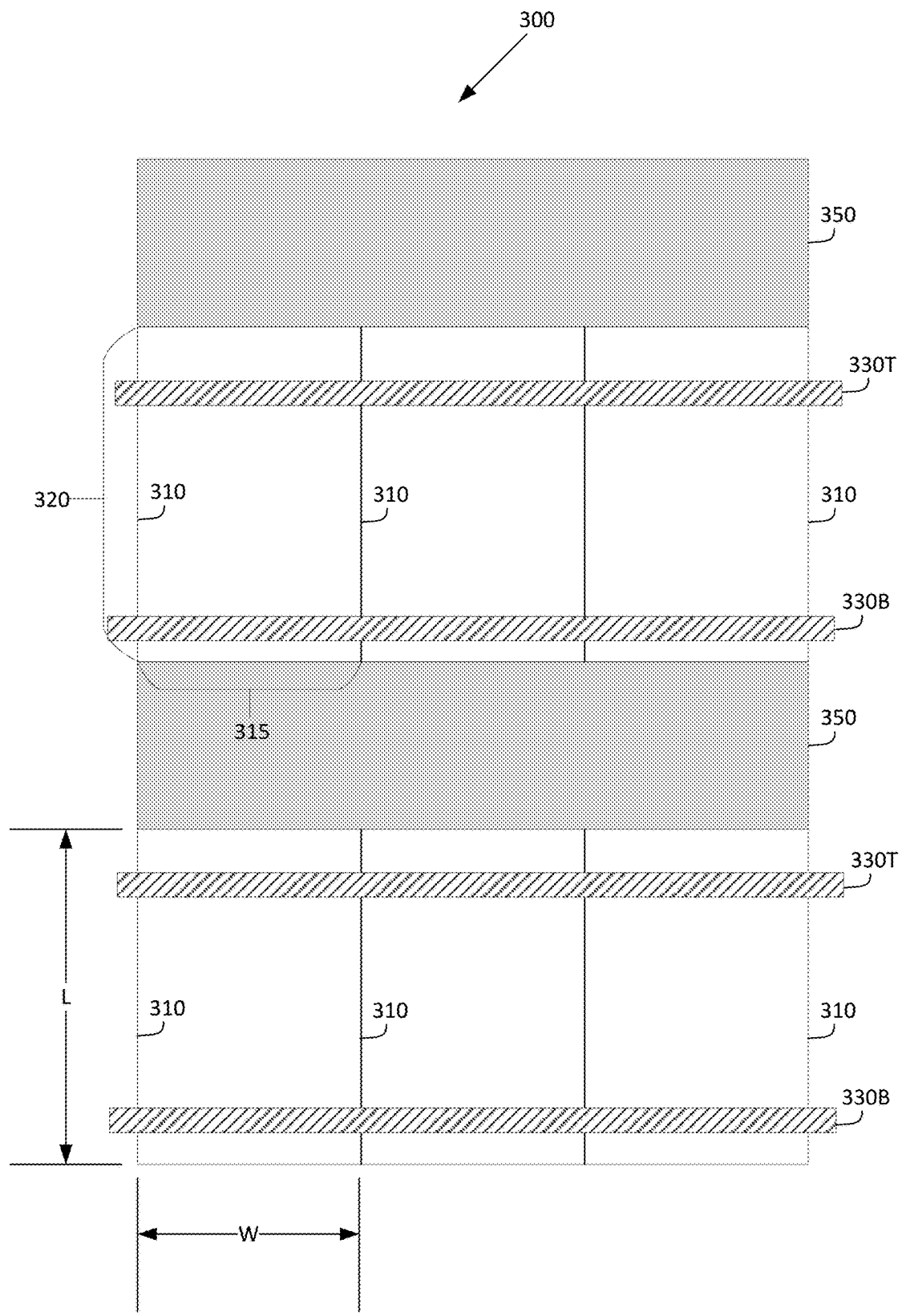
FIG. 4 is a depiction of an installation of solar panels in a portrait orientation, in accordance with examples of the present disclosure.
Figure 5:
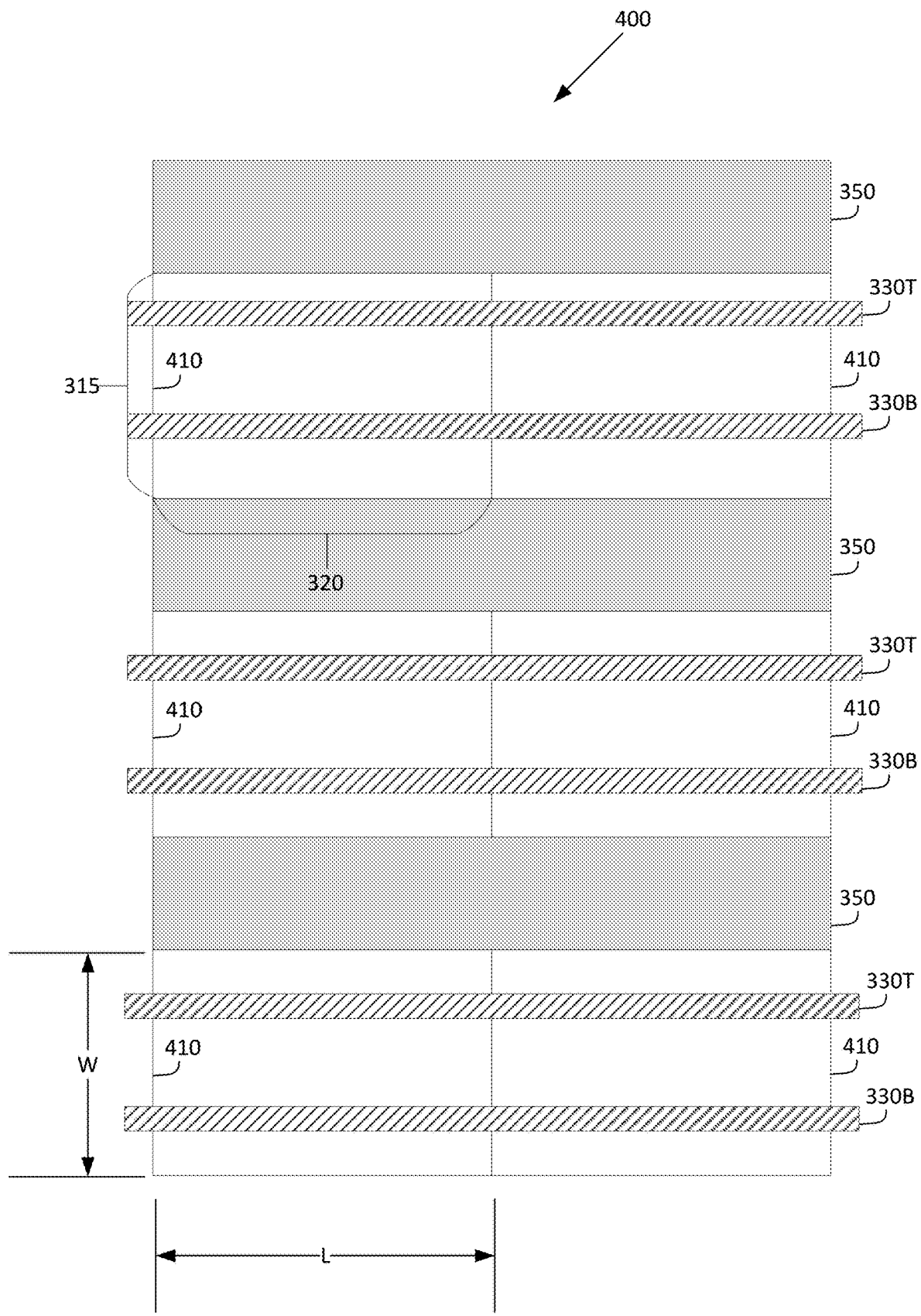
FIG. 5 is a depiction of an installation of solar panels in a landscape orientation, in accordance with examples of the present disclosure.

Reference is now made to FIG. 4, which is a depiction of an installation 300 of solar panels 310, such as the solar panels 100, 200 of FIGS. 1-2, in a portrait orientation. Reference is additionally made to FIG. 5, which is a depiction of an installation 400 of solar panels 410, such as the solar panels 100, 200 of FIGS. 1-2, in a landscape orientation. Solar panels 310, 410 may be similar to or the same as any of solar panels 100, 200 as described with respect to FIGS. 1-3. Solar panels 310, 410 are typically installed on a pair of metal racks 330T, 330B, one metal rack 330T of the pair of metal racks 330T, 330B being disposed at the top of the solar panels 310, 410. A second metal rack 330B of the pair of metal racks 330T, 330B being disposed at the bottom of the solar panels 310. The solar panels 310, 410 may cast a shadow 350 due to their angle with respect to the sun.

It may be the case that installers would prefer to install the solar panels 310, 410 in landscape configuration, as in FIG. 5, in order to try to avoid mutual shading caused by shade of panels on one set of metal racks 330T, 330B shading panels installed on a second set of metal racks 330T, 330B. However, using a landscape configuration may result in fewer panels resting on the metal racks 330T, 330B as opposed to using a portrait configuration on those same racks. Further, some solar panels might not include cables of sufficient length to enable connecting panels arranged in a landscape manner.

A solar panel 310 may be considered to be in portrait orientation if its short edge 315 is oriented substantially parallel to the length of the pair of metal racks 330T, 330B, as depicted in FIG. 4. A solar panel 410 may be considered to be in landscape orientation if its long edge 320 is oriented substantially parallel to the length of the pair of metal racks 330T, 330B, as depicted in FIG. 5.

The term "substantially" used herein includes variations that are equivalent for an intended purpose or function.

For solar panels of a given length (L) and width (W), in a typical installation, more panels in a portrait orientation (as shown in FIG. 4) will fit on one pair of the racks 330T, 330B than will panels in a landscape orientation (as shown in FIG. 5) on the same pair of racks 330T, 330B. For example, three panels may be mounted in portrait orientation, whereas only two panels may be mounted in landscape orientation.

Additionally, since the terminals T+ and T− are arranged along one of the long edges 320 of the solar panel 100, 200, as shown in FIGS. 1 and 2, in a portrait orientation (as depicted in FIG. 4), less cabling may be used to connect the solar panels 310 to optimizers and inverters (not depicted) which are typically located to the side of the solar panels and the installation.

Figure 6:
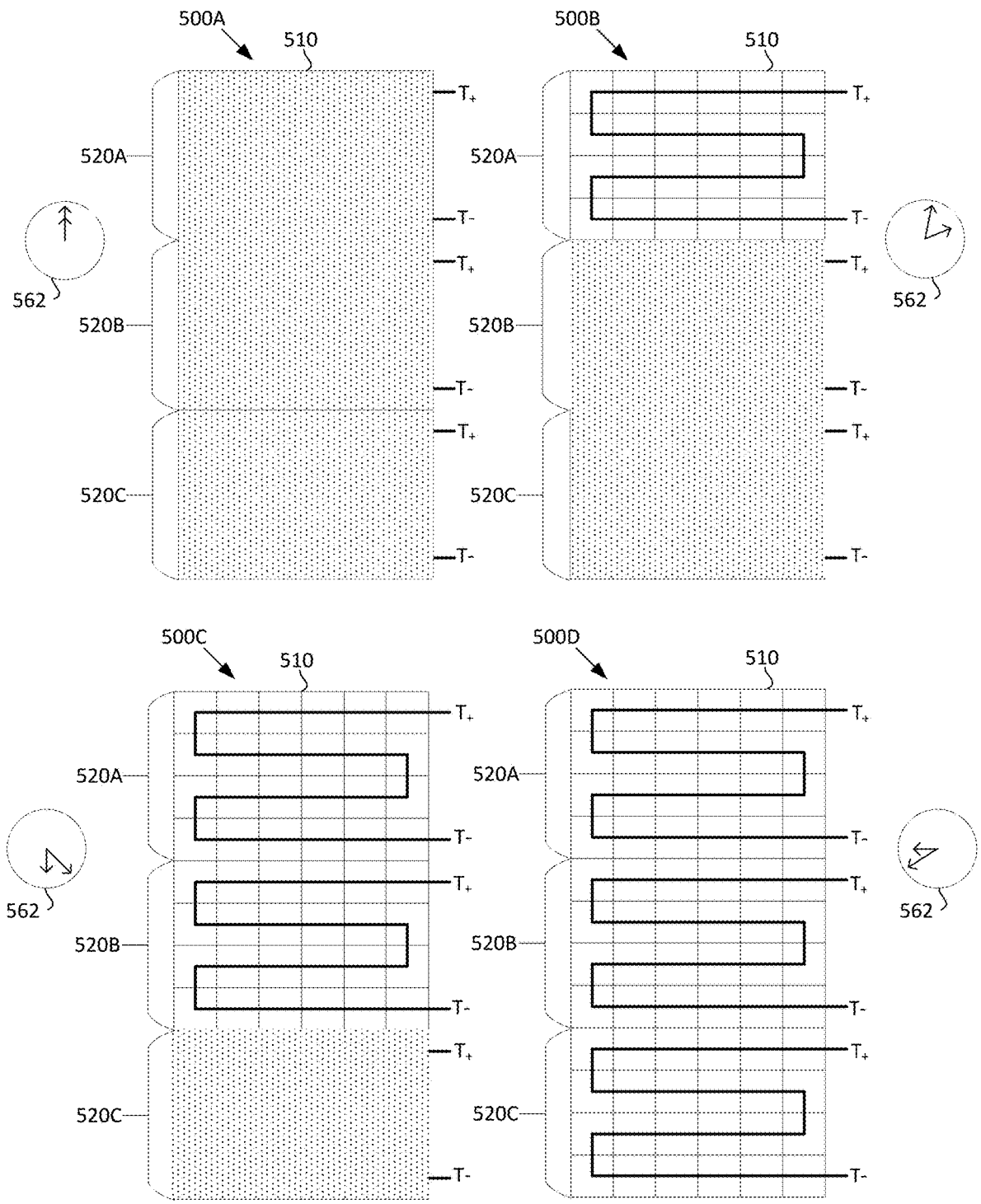
FIG. 6 is a depiction of a solar panel in various stages of partial shading, in accordance with examples of the present disclosure.

Reference is now made to FIG. 6, which is a depiction of a solar panel 510, such as the solar panels 100, 200 of FIGS. 1-2, in various stages of partial shading. The solar panel 510 is depicted as having three substrings 520A, 520B, 520C. In a first stage of shading 500A, where a solar panel 510 is depicted in a state of complete shade or completely covered by snow, dust, or any other material which may accumulate over time, including, but not limited to, falling leaves, the three substrings 520A, 520B, 520C are shown as covered. A clock face 562 is shown to indicate the passage of time from one stage of shading/coverage of the solar panel 510 to another stage.

In a second stage of shading 500B, the solar panel 510 is depicted in a state of less complete coverage by shade or snow than was depicted in the first stage of shading 500A. At a certain point in time (as noted above, the passage of time is indicated by clock face 562), enough shade has cleared or enough snow has melted, and substring 520A may now be able to return to regular levels of energy production, for example, a level of energy production for substring 520A prior to the state of the solar panel 510 depicted in the first stage of shading 500A.

In a third stage of shading 500C, the solar panel 510 is depicted in a state of less complete coverage by shade or snow than was depicted in the second stage of shading 500B. At a certain point in time (as noted above, the passage of time is indicated by clock face 562), enough shade has cleared or enough snow has melted, and substring 520B, in addition to substring 520A, is now able to return to regular levels of energy production, for example, a level of energy production for substring 520B prior to the state of the solar panel 510 depicted in the first stage of shading 500A and in the second stage of shading 500B.

The second stage of shading 500B and the third stage of shading 500C are also typical of mutual shading situations, where shade from a first rack of solar panels (as in FIG. 4) falls on the bottom of a second, neighboring, rack of solar panels. As depicted here in third stage of shading 500C, despite the shade caused by the first rack of solar panels, substrings 520A and 520B are still able to produce power.

In a final stage 500D, the solar panel 510 is depicted as now having returned to a state where there is no covering by shade or snow. At a certain point in time (as noted above, the passage of time is indicated by clock face 562), enough shade has cleared or enough snow has melted, and substring 520C, in addition to substrings 520A and 520B, is now able to return to regular levels of energy production, for example, a level of energy production for substring 520C prior to the state of the solar panel 510 depicted in the previous stages of shading 500A, 500B, and 500C.

During second stage 500B (where substrings 520B and 520C are shaded) and during third stage 500C (where substring 520C is shaded), design of panel 510 as disclosed herein above (see, for instance the discussion of FIGS. 2A and 2B) may provide increased power. As a numerical example, during third stage 500C, substrings 520A and 520B may receive full irradiance enabling the substrings 520A and 520B to output 10 A and 13V at a maximum power point, and substring 520C may be partially shaded, reducing substring 520C to output, at a maximum power point, 13V and a current proportional to the percentage of solar irradiance received by substring 520C compared to substrings 520A and 520B.

box 630B-1. When solar panel 620-1 is flipped as described by the dotted curves, the new orientations of corners 621 and 631 is as indicated.

Thus, the corresponding junction boxes 630A, 630B (as seen by 620-2) are now positioned next to one another to enable simple interconnection of the two solar panels, using short cables. Solar panels 610, 620 may be connected in series, by connecting the positive terminal of junction box 630A to the negative terminal of junction box 630B (or vice-versa), and providing the negative terminal of junction box 630A and the positive terminal of junction box 630B for connection to other solar panels, power devices, etc. The series connection between the solar panels 610, 620 may be achieved, e.g., by using short cables that have connectors, or, where solar panels 610 and 620 are flush against one another, by using terminals arranged on frames of solar panels 610, 620. Solar panels 610, 620 may be connected in parallel, by connecting the positive terminal of junction box 630A to the positive terminal of junction box 630B (e.g., via a T-connector, or via internal connections of a combiner box or power converter), and similarly connecting the positive terminal of negative box 630A to the negative terminal of junction box 630B, and providing a connection to the positive and negative terminals of the junction boxes.

Figure 8:
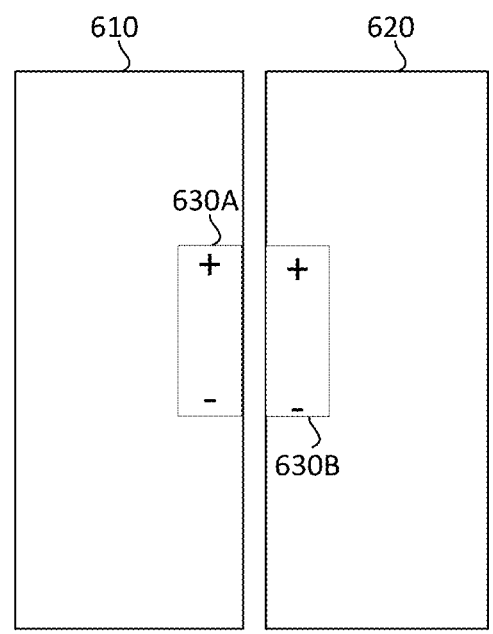
FIG. 8 is a depiction of two solar panels having a 2:1 parallel connection, in accordance with examples of the present disclosure.

Reference is now made to FIG. 8, which is a depiction of two solar panels, such as the solar panels 610, 620 (both corresponding, for example, to solar panel 100 of FIG. 1) being arranged such that the corresponding junction boxes 630A, 630B are positioned next to one another to enable simple interconnection of the two solar panels, using short cables. In the illustrative implementation of FIG. 8, solar panel 610 is designed to have a junction box disposed on the

| Irradiance percentage | Panels designed with "U" shaped substrings 101 as depicted in FIG. 1 | Panel designed as depicted in FIG. 2A, having diodes | Panel designed as depicted in FIG. 2B, having switches | Panel designed as depicted in FIG. 2B, having optimizers |
|---|---|---|---|---|
| %50 Imp_c = 5A | All substrings are shaded: 2 * 13 * 5 = 130 | 520C is bypassed: −1 * 10 + 2 * 13 * 10 = 250 | 520C is bypassed: −0.1 * 10 + 2 * 13 * 10 = 259 | 520C is optimized: 5 * 13 + 2 * 13 * 10 = 325 |
| %80 Imp_c = 8A | All substrings are shaded: 2 * 13 * 8 = 208 | All substrings are shaded: 2 * 13 * 8 = 208 | All substrings are shaded: 2 * 13 * 8 = 208 | 520C is optimized: 8 * 13 + 2 * 13 * 10 = 364 |

For simplicity, in the above table, it is assumed that there are two substrings, Thus, for example, when discussing the case when "all substrings are shaded", twos substrings, at, for example 5 A, of 13 cells gives 2*5*8=130. For example, when the substring 520C is bypassed, a forward contact diode is assumed to be −1V. The same is true, mutatis mutandis. In other cells in the above table.

Figure 7:
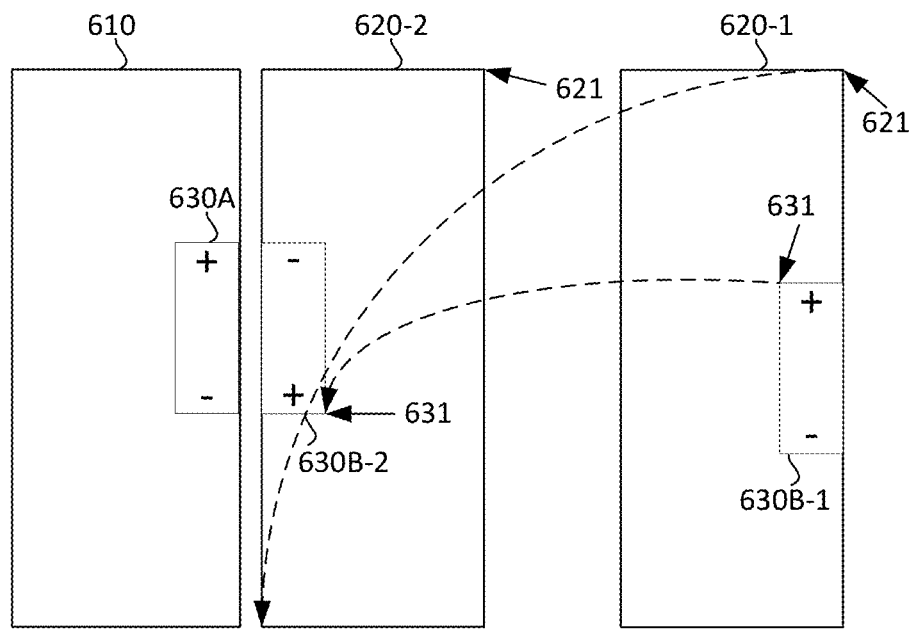
FIG. 7 is a depiction of two solar panels having a 2:1 serial connection, in accordance with examples of the present disclosure.

Reference is now made to FIG. 7, which is a depiction of two solar panels, such as the solar panels 610, 620 (both corresponding, for example, to solar panel 100 of FIG. 1) being arranged such that the corresponding junction boxes 630A, 630B are positioned next to one another to enable simple interconnection of the two solar panels, using short cables. In the illustrative implementation of FIG. 7, solar panels 610 and 620 (as seen by 620-1) are both designed to have a junction box (630A and 630B as seen by 630B-1) disposed on the right side of the panel, when viewing the solar panel side having the junction box. Therefore, solar panel 620 is flipped top-to-bottom, to cause junction boxes 630A, 630B (as seen by 620-2) to be adjacent to one another. This is indicated by showing two dotted curves originating at corner 621 of solar panel 620-1 and corner 631 of junction right side of the panel, when viewing the solar panel side having the junction box, and solar panel 620 is designed to have a junction box disposed on the left side of the panel, when viewing the solar panel side having the junction box. This arrangement may simplify installation, by not including a rotation of solar panel 620 as required for the solar panels of FIG. 7.

Figure 9A:
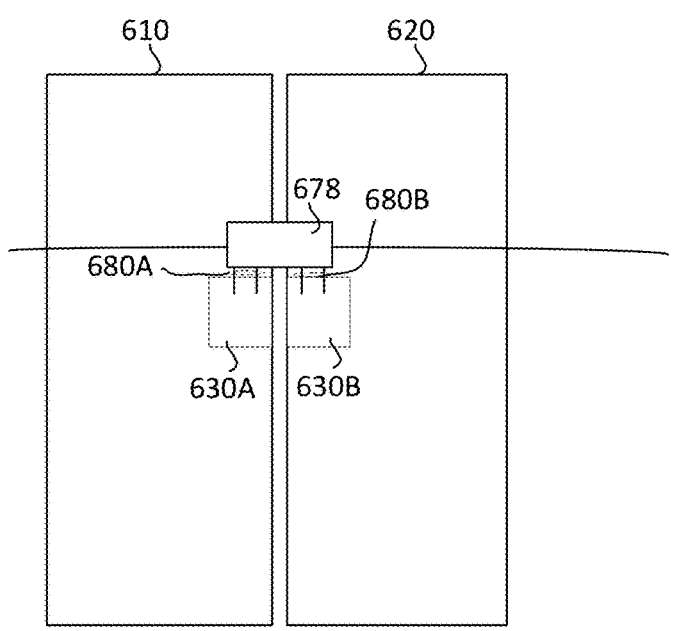
FIG. 9A is a depiction of an optimizer having four connections, two per panel.
Figure 10:
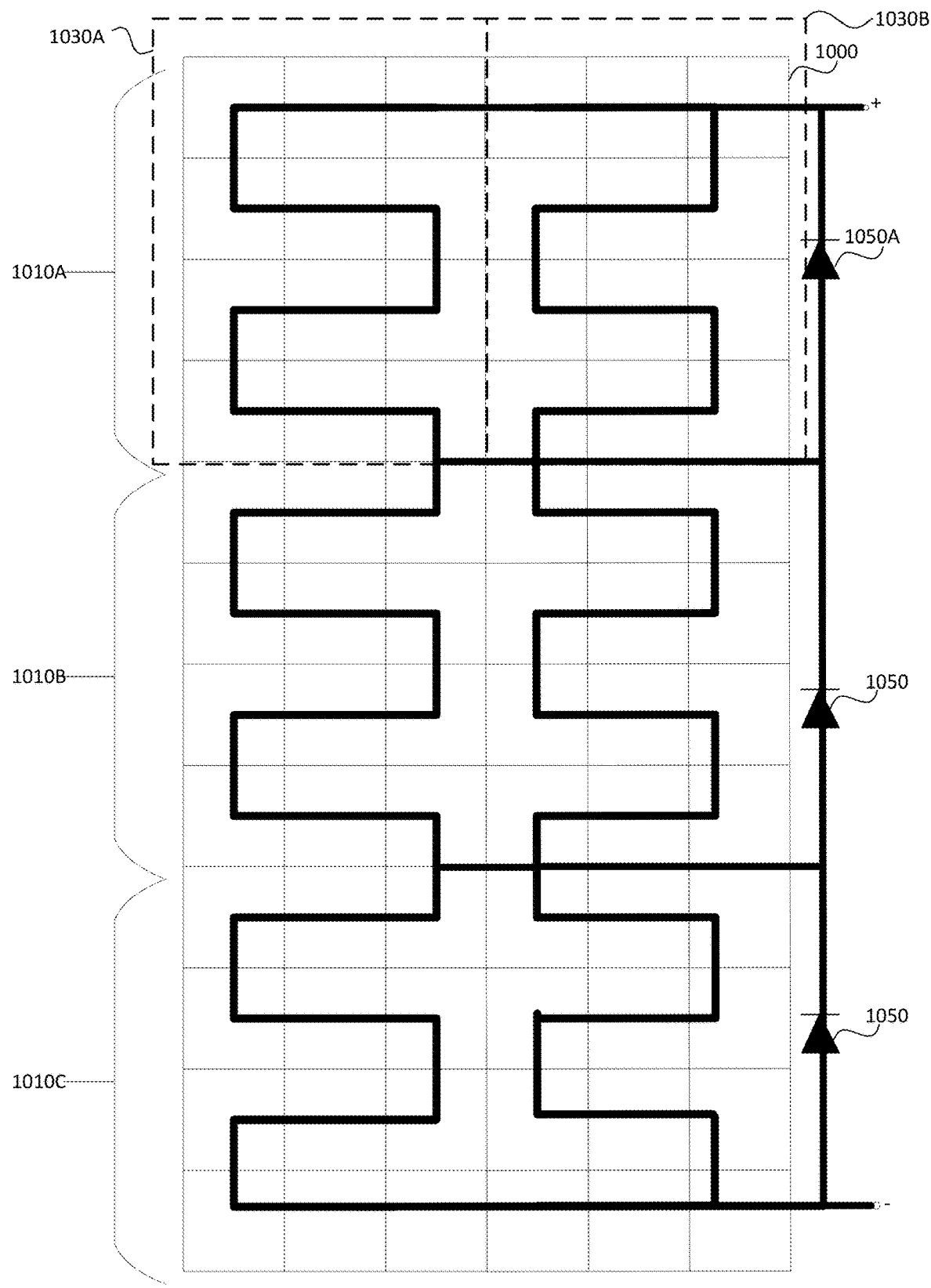
FIG. 10 is a simplified pictorial illustration of a solar panel, depicting another arrangement of substrings of solar cells, in accordance with examples of the present disclosure.

Reference is now made to FIG. 10, which is a depiction of the two solar panels 610, 620 of FIG. 7 and FIG. 8 connected with a shared optimizer 678. The orientation of the positive and negative terminals in FIGS. 7 and 8 are not depicted in the junction boxes 630A, 630B. Conductors 680A (e.g., cables having connectors) are connected to positive and negative terminals of panel 610, and conductors 680B are connected to positive and negative terminals of panel 620, and cables. As is seen in FIG. 9A, optimizer 678 is disposed between the junction boxes 630A, 630B. According to some features, optimizer 678 may connect panels 610 and 620 in series or in parallel. According to some features, optimizer 678 may include switches configured to selectively connect panels 610 in series or in parallel, depending on desired input current and voltage and/or desired output current and voltage. Optimizer 678 may further short circuit and/or disconnect panels 610 and 620 to reduce input voltage to optimizer 678, for example, in response to a potentially unsafe condition (e.g., a fire our power outage). Optimizer 678 may include a DC/DC converter configured to draw increased power from panels 610, 620 by setting a common operating point for both of panels 610, 620. Optimizer 678 may include a dual-input DC/DC converter or separate DC/DC converters configured to individually set desired operating points for the panels 610,620. Although not depicted, it is noted that an optimizer, such as optimizer 678 may have a wired connection to another optimizer (which may, functionally, be the same or similar to optimizer 678) in a string of solar panels.

Figure 9B:
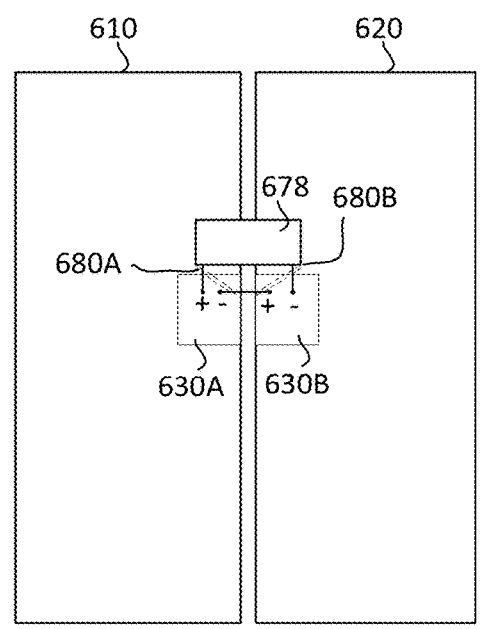
FIG. 9B is a depiction of serial connected panels sharing an external optimizer.

Reference is now made to FIG. 9B, which is a depiction of the two solar panels 610, 620 of FIG. 7 and FIG. 8 connected with a shared optimizer 678. In the depiction of FIG. 9B, solar panels 610 and 620 are connected in series, and the series connection of solar panels 610, 620 is connected at the input to optimizer 678. In some embodiments, T-connectors may be used to hard-wire solar panels 610 and 620 so as to be connected in parallel outside the optimizer. In some embodiments, optimizer 678 can be mechanically mounted to a rack between solar panels 610 and 620, or to one of the solar panels 610 or 620, or to the rack supporting one of the solar panels 610, 620. In other embodiments, the optimizer 678 may instead be any box having active electronics, including monitoring and/or safety modules.

According to the above disclosure, an amount of power generated per day may then be calculated according to the following formula:

$$P_{total\_per\_day} = P_{STC} \cdot \left[ T_{STC} + \frac{N - N_{sub}}{N} \cdot T_{MS} \right] = P_{STC} \cdot [T_{STC} + A \cdot T_{MS}]$$

Where:
PSTC is the power output of the solar panel (such as solar panel 100, 200) on a regular basis;
TSTC is an amount of time in a day when the solar panel is not shaded;
TMS is an amount of time in a day when the solar panel is affected by shading;
N is the number of substrings (such as substring 110A, 110B, 110C of FIG. 1) in a solar panel;
NSUB is the number of substrings in the solar panel which are affected by mutual shading; and
A is a ratio of mutual shading, defined by the following equation:

$$A = \frac{N - N_{sub}}{N}$$

Tpeak_sun_hours is an amount of time when usable light from the sun is at peak during a given day (typically from 4-7 hours a day), defined by the following equation:

$$T_{peak\_sun\_hours} = T_{STC} + T_{MS}$$

Using the above equations, by way of a non-limiting example, if the above variables are set to the following values, then the power generated per day, Ptotal_per_day may be calculated for those existing systems described above with reference to FIG. 1, as well as for systems where the substrings are arranged according to examples as disclosed herein:

| Value | Example 1 | Example 2 | Example 3 | Example 4 |
|---|---|---|---|---|
| Pstc (W) | 375 | 375 | 375 | 375 |
| Tpeak_sun_hours (h) | 7 | 7 | 6 | 4 |
| TSTC (h) | 6 | 6 | 4 | 3 |
| TMS (h) | 1 | 1 | 2 | 1 |
| N | 4 | 3 | 3 | 3 |
| NSUB | 1 | 1 | 1 | 2 |
| A | 0.75 | 0.67 | 0.67 | 0.33 |

The following tables show the results of the calculation of Ptotal_per_day for each of the above examples, and a measure of daily efficiency (daily eff) as a percent, where daily efficiency is calculated as Ptotal_per_day divided by total potential power without any shading. The total potential power without any shading is calculated as Pstc*Tpeak_sun_hours. It is noted that in cases of mutual shading, snow may cover the shaded section of the solar panel, so it may be the case that there is 100% power loss even in a case when there is partial mutual shading. The final column, "Improvement" indicates, as a percent, an amount of power added, on a daily basis using the system disclosed herein versus existing systems. The "Improvement" is calculated based on the Ptotal_per_day of the existing systems and the Ptotal_per_day of the disclosed system. It should be noted that in examples of the present disclosed systems there can be cases where NSUB<N, and even NSUB=1. For example, in FIG. 6 stage 500C, a single substring 520C is shaded. However in the same case in existing systems, such as those described above with reference to FIG. 1 were in the same state of shading 500C, then each substring (for example all 3 "U" shaped substrings 101) would be affected by the mutual shade on the bottom of the solar panel, i.e., NSUB=N, and A=0.

| Example 1 | | | | |
|---|---|---|---|---|
| | Existing Systems NSUB = N | Disclosed System NSUB = 1 | Total Potential Power TMS = 0 | Improvement |
| Ptotal_per_day | 2250 | 2531.25 | 2625 | 13% |
| daily eff | 86% | 96% | 100% | |

| Example 2 | | | | |
|---|---|---|---|---|
| | Existing Systems NSUB = N | Disclosed System NSUB = 1 | Total Potential Power TMS = 0 | Improvement |
| Ptotal_per_day | 2250 | 2500 | 2625 | 11% |
| daily eff | 86% | 95% | 100% | |

Example 3

|  | Existing Systems NSUB = N | Disclosed System NSUB = 1 | Total Potential Power TMS = 0 | Improvement |
|---|---|---|---|---|
| Ptotal_per_day | 1500 | 2000 | 2250 | 33% |
| daily eff | 67% | 89% | 100% |  |

Example 4

|  | Existing Systems NSUB = N | Disclosed System NSUB = 2 | Total Potential Power TMS = 0 | Improvement |
|---|---|---|---|---|
| Ptotal_per_day | 1125 | 1250 | 1500 | 11% |
| daily eff | 75% | 83% | 100% |  |

Reference is now made to FIG. 10, which is a simplified pictorial illustration of a solar panel 1000, depicting another arrangement of substrings of solar cells in accordance with examples of the present disclosure. In the arrangement of substrings of solar cells depicted in FIG. 10, the solar panel 1000 may provide flexibility in installation schemes, enabling both portrait and landscape orientation while providing features for enhanced production in case of partial shading in various installation schemes. FIG. 10 is discussed with reference to FIG. 2A. Solar panel 1000 of FIG. 10 is the same as solar panel 102 of FIG. 2A, except that each substring of solar panel 1000 may be divided into two parallel-connected sub-substrings. Substring 1010A (corresponding to substring 110A of FIG. 2A) may be divided into two sub-substrings 1030A (shown in a first dashed box) and 1030B (shown in a second dashed box). The solar cells in first sub-substring 1030A are connected in series, and the solar cells in second sub-substring 1030B are connected in series. Sub-substrings 1030A and 1030B are connected in parallel, forming substring 1010A. Diode 1050A is connected in parallel across substring 1010A. A similar configuration may be provided for substrings 1010B and 1010C (corresponding to substring 110B and 110C of FIG. 2A.)

Similarly to the description of solar panel 102 of FIG. 2A, in the event of partial shading (e.g., on the top or bottom) of solar panel 1000, a bypass diode (e.g., 1050A or 1050B) may enter conduction mode, providing a bypass of the respective substring. In the event of partial shading on one side of the solar panel 1000 (e.g., the right side of solar panel 1000 is shaded, and therefore sub-substring 1030B is partially or fully shaded), the sub-substring connected in parallel to the shaded sub-substring (e.g., the sub-substring 1030A) might not be affected by the shading, and may retain current production in accordance with its own solar irradiance. Since the substrings in the first box 1030A and the second box 1030B are in parallel, one of the two substring is still able to retain full current production (in potential, up to its maximum production level, and practically—according to its own solar irradiance), thereby retaining a significant portion of the production of the solar panel 1000. Solar panel 1000 may allow enhanced installation flexibility. For example, when installing solar panels 1000, an installer may install some solar panels 1000 in a portrait orientation and some solar panels 1000 in a landscape orientation according installation space available (e.g., a size of a roof or area available in a ground-mounted system), while providing enhanced production under partial shading for panels installed in both orientations.

The skilled person will appreciate that inventive aspects disclosed herein include a method or system as in any of the following clauses:

CLAUSES

1. A solar panel comprising at least one substring of solar cells, wherein a substring of the at least one substring of solar cells has a plurality of long members, and at least one short member, each one of the at least one short member being disposed between two of the plurality of long members, and the plurality of long members being disposed substantially parallel to one another and parallel to an edge of the solar panel, the edge having a short dimension of the solar panel.
2. The solar panel of clause 1, wherein the substring of the at least one substring of solar cells comprises a positive terminal and a negative terminal.
3. The solar panel of clause 2, wherein the positive terminal and the negative terminal are disposed along a second edge of the solar panel, the second edge having a long dimension of the solar panel.
4. The solar panel of clause 2, wherein the positive terminal and the negative terminal of the substring of the at least one substring of solar cells are connected to an optimizer.
5. The solar panel of clause 4, wherein a positive terminal and a negative terminal of a second substring of the at least one substring of solar cells are connected to the optimizer.
6. The solar panel of clause 2, wherein the positive terminal and the negative terminal of the substring of the at least one substring of solar cells are connected to a bypass diode.
7. The solar panel of clause 6, wherein a positive terminal and a negative terminal of a second substring of the at least one substring of solar cells are connected to the bypass diode.
8. The solar panel of any of clauses 1-7, wherein the solar panel is deployed using a portrait orientation.
9. The solar panel of any of clauses 1-8, wherein a first substring of the at least one substring of solar cells is oriented to be less shaded than a second substring of the at least one substring of solar cells.
10. The solar panel of any of clauses 1-9, wherein the at least one substring of solar cells is disposed above a second substring of the at least one substring of solar cells.
11. The solar panel of any of clauses 1-10, wherein the substring of the at least one substring of solar cells comprises a same number of solar cells as each other of the at least one substring of solar cells.
12. The solar panel of any of clauses 1-11, wherein a first substring of the at least one substring of solar cells disposed below a second substring of the at least one substring of solar cells comprises fewer solar cells than the first substring.
13. The solar panel of any of clauses 1-12, wherein the solar panel is connected to a junction box.
14. The solar panel of clause 13, wherein a second solar panel is connected to the junction box, and the solar panels are in serial connection or parallel connection.
15. A solar panel having a frame having a long edge and a short edge, and a plurality of substrings of solar cells, each substring having two terminals, wherein the two terminals of each of the plurality of substrings are disposed along a side of the panel corresponding to the long edge of the frame.

16. The solar panel of clause 15, wherein the two terminals comprise one positive terminal and one negative terminal.

17. The solar panel of any of clauses 15-16, wherein the two terminals are connected to an optimizer.

18. The solar panel of clause 17, wherein the optimizer is a shared optimizer or a non-shared optimizer.

19. The solar panel of any of clauses 15-19, wherein the two terminals are connected to a bypass diode.

20. The solar panel of clause 19, wherein the bypass diode is a shared bypass diode or a non-shared bypass diode.

21. The solar panel of any of clauses 15-20, wherein the solar panel is deployed using a portrait orientation.

22. The solar panel of any of clauses 15-21, wherein a first substring of the plurality of substrings of solar cells is oriented to be less shaded than a second substring of the plurality of substrings of solar cells.

23. The solar panel of any of clauses 15-22, wherein at least one substring of solar cells is disposed above a second substring of the plurality of substrings of solar cells.

24. The solar panel of any of clauses 15-23, wherein the solar panel is connected to a junction box.

25. The solar panel of clause 24, wherein a second solar panel is connected to the junction box, and the solar panels are connected in one of a serial connection or a parallel connection.

26. A solar panel having a plurality of photovoltaic substrings of solar cells, designed such that when deployed using a portrait orientation, at least one photovoltaic substring of the plurality of photovoltaic substrings of solar cells is oriented to be less shaded than a second substring of the plurality of photovoltaic substrings of solar cells.

It is appreciated that various features of the disclosure which are, for clarity, described in the contexts of separate examples may also be provided in combination in a single example. Conversely, various features of the disclosure which are, for brevity, described in the context of a single example may also be provided separately or in any suitable sub-combination.

It will be appreciated by persons skilled in the art that the present disclosure is not limited by what has been particularly shown and described hereinabove. Rather the scope of the disclosure is defined by the appended claims and equivalents thereof:

What is claimed is:

1. A solar panel comprising:
   a frame;
   a first plurality of terminals in the interior of the frame, comprising: a first terminal, a second terminal, a third terminal and a fourth terminal;
   a second plurality of terminals on the exterior of the frame;
   a plurality of substrings of solar cells, comprising: a first substring and a second substring;
   a plurality of direct current (DC) to DC converters, comprising: a first DC to DC converter and a second DC to DC converter; and
   a switch;
   wherein each substring of the plurality of substrings of solar cells comprises:
   a plurality of long members;
   at least one short member, each one of the at least one short member being disposed between two of the plurality of long members, and the plurality of long members being disposed substantially parallel to one another and parallel to an edge of the solar panel, the edge having a short dimension of the solar panel;
   the first substring comprises a first plurality of solar cells serially connected between the first terminal and the second terminal using a first set of two long members of the plurality of long members and a first short member of the at least one short member;
   the second substring comprises a second plurality of solar cells serially connected between the third terminal and the fourth terminal using a second set of two long members of the plurality of long members and a second short member of the at least one short member;
   the first DC to DC converter is connected between the first terminal and the second terminal across the first substring;
   the switch is connected between the second terminal and the third terminal between the first DC to DC converter and the second DC to DC converter;
   the second DC to DC converter is connected between the third terminal and the fourth terminal across the second substring; and
   the first DC to DC converter, the switch, and the second DC to DC converter are connected serially between the second plurality of terminals.

2. The solar panel according to claim 1, wherein the second plurality of terminals comprises a positive terminal and a negative terminal, and the second plurality of terminals are disposed along a second edge of the solar panel, the second edge having a long dimension of the solar panel.

3. The solar panel according to claim 1, wherein the first DC to DC converter and the second DC to DC converter are configured to execute at least one of: Maximum Power Point Tracking (MPPT); and impedance matching.

4. The solar panel according to claim 1, wherein the first substring is connected in series to the second substring between second plurality of terminals.

5. The solar panel according to claim 1, further comprising a first diode connected between the first terminal and the second terminal, and a second diode connected between the third terminal and the fourth terminal.

6. The solar panel according to claim 1, wherein the first substring is connected in parallel to a third substring between the first terminal and the second terminal, and the second substring is connected in parallel to a fourth substring between the third terminal and the fourth terminal.

7. The solar panel according to claim 1, wherein, when installed in a portrait orientation, the first substring is disposed above the second substring of the plurality of substrings of solar cells.

8. The solar panel according to claim 1, wherein the first substring is disposed above the second substring, and the second substring is disposed above a third substring.

9. The solar panel according to claim 1, wherein the first substring comprises a same number of solar cells as the second substring.

10. The solar panel according to claim 1, wherein the second plurality of terminals are connected to a junction box.

11. The solar panel according to claim 10, wherein a second solar panel is connected to the junction box, and the solar panel and the second solar panel are in serial connection or parallel connection.

12. The solar panel according to claim 11, wherein the second solar panel has the features of the solar panel of claim 1, and the first terminal of the solar panel is connected to the fourth terminal of the second solar panel.

13. The solar panel according to claim 1, and further comprising a third substring, wherein the third substring is connected in parallel to the first substring between the first terminal and the second terminal.

14. The solar panel according to claim 1,
the first plurality of terminals further comprising: a fifth terminal and a sixth terminal;
the plurality of substrings of solar cells further comprising: a third substring;
the plurality of DC to DC converters further comprising a third DC to DC converter;
wherein:
the third substring comprises a third plurality of solar cells serially connected between the fifth terminal and the sixth terminal using a third set of two long members of the plurality of long members and a third short member of the at least one short member; and
the third DC to DC converter is connected between the fifth terminal and the sixth terminal.

15. The solar panel according to claim 14, further comprising a first diode connected between the first terminal and the second terminal, a second diode connected between the third terminal and the fourth terminal, and a third diode connected between the fifth terminal and the sixth terminal.

16. The solar panel according to claim 14, further comprising a second switch connected between the fourth terminal and the fifth terminal.

17. The solar panel according to claim 13, further comprising a fourth substring, wherein the fourth substring is connected in parallel to the second substring between the third terminal and the fourth terminal.

18. The solar panel according to claim 14, further comprising a fourth substring, a fifth substring and a sixth substring, wherein the fourth substring is connected in parallel to the first substring between the first terminal and the second terminal, the fifth substring is connected in parallel to the second substring between the third terminal and the fourth terminal, and the sixth substring is connected in parallel to the third substring between the fifth terminal and the sixth terminal.

19. The solar panel according to claim 2, wherein the first DC to DC converter and the second DC to DC converter are disposed along the second edge of the solar panel.

20. The solar panel according to claim 1, further comprising a controller configured to operate the switch based on an indication related to at least one of: overheating, over-voltage, and over-current.

* * * * *